United States Patent
Feng

(10) Patent No.: US 9,343,511 B1
(45) Date of Patent: May 17, 2016

(54) PIXEL ARRANGEMENT STRUCTURE FOR ORGANIC LIGHT-EMITTING DIODE

(71) Applicant: EverDisplay Optronics (Shanghai) Limited, Shanghai (CN)

(72) Inventor: Yu Hsiung Feng, Shanghai (CN)

(73) Assignee: EverDisplay Optronics (Shanghai) Limited, Shanghai (CN)

( * ) Notice: Subject to any disclaimer, the term of this patent is extended or adjusted under 35 U.S.C. 154(b) by 0 days.

(21) Appl. No.: 14/645,097

(22) Filed: Mar. 11, 2015

(30) Foreign Application Priority Data

Oct. 29, 2014 (CN) .......................... 2014 1 0596588

(51) Int. Cl.
*H01L 27/32* (2006.01)

(52) U.S. Cl.
CPC ........ *H01L 27/3218* (2013.01); *H01L 27/3211* (2013.01)

(58) Field of Classification Search
CPC .................. H01L 27/3218; H01L 27/3211
See application file for complete search history.

(56) References Cited

U.S. PATENT DOCUMENTS

| 2008/0001536 A1* | 1/2008 | Tsai | H01L 27/3211 313/506 |
| 2012/0092238 A1* | 4/2012 | Hwang | G09G 3/20 345/55 |

* cited by examiner

*Primary Examiner* — Mamadou Diallo
(74) *Attorney, Agent, or Firm* — Wang Law Firm, Inc.

(57) ABSTRACT

A pixel arrangement structure for an organic light-emitting diode includes a plurality of red subpixel groups, a plurality of green subpixel groups, and a plurality of blue subpixel groups. Each red subpixel group is comprised of a plurality of red subpixels. Each green subpixel group is comprised of a plurality of green subpixels. Each blue subpixel group is comprised of a plurality of blue subpixels. The red subpixel groups, the green subpixel groups, and the blue subpixel groups are spaced from each other. One of the red subpixels of the red subpixel groups, one of the green subpixels of the green subpixel groups, and one of the blue subpixels of the blue subpixel groups, which are adjacent to each other, together form a pixel. The subpixels of the same color are gathered to form a subpixel group to increase the aperture ratio of metal masks.

10 Claims, 7 Drawing Sheets

PIXEL ARRANGEMENT STRUCTURE FOR ORGANIC LIGHT-EMITTING DIODE

BACKGROUND OF THE INVENTION

The present invention relates to the field of organic light-emitting diodes, more particularly, to a pixel arrangement structure for an organic light-emitting diode.

In the flat panel display techniques, organic light-emitting diode (OLED) display panels are recognized as the third generation display technique following liquid crystal displays (LCD) due to the advantages of thin and light structure, active illumination, high speed response, large display area, rich colors and high luminance, low power consumption, and wide operating temperature range. Organic light-emitting diodes include passive matrix organic light-emitting diodes (PMOLEDs) and active matrix organic light-emitting diodes (AMOLEDs). PMOLEDs can only be used to produce small-size low-resolution display panels. Since AMOLEDs can be driven by integrating a thin-film transistor (TFT) and a capacitor in each pixel and by using the capacitor to maintain the voltage, AMOLEDs can be used to produce large-size high-resolution panels and are the key research field and the developing trend of future display techniques.

FIGS. 1 and 2 shows two examples of conventional pixel arrangement structures for organic light-emitting diodes. Each pixel arrangement structure includes a plurality of pixels 90 arranged in a repeated manner. Each pixel 90 includes a red subpixel 91, a green subpixel 92, and a blue subpixel 93. The red subpixel 91, the green subpixel 92, and the blue subpixel 93 are square and adjacent to each other and are arranged in a regular pattern. However, it is difficult for the conventional OLEDs to meet the requirements of high resolution and high luminance of the displays of electronic devices. This is because when the resolution of the OLED is above 300 PPI (pixel per inch), it is difficult to deposit organic illuminating materials with metal masks in the conventional pixel arrangement structure of bar-shaped arrangement. Furthermore, a compromise between the luminance and the service life is required, because the current density injected into the OLED is large due to the low aperture ratio. Although a PenTile pixel arrangement structure of a higher efficiency has been proposed, it suffers disadvantages of vision crosstalk, obvious Moiré effect, and aggregation of zigzag problems of slant lines.

BRIEF SUMMARY OF THE INVENTION

In view of the foregoing disadvantages, the present invention provides a pixel arrangement structure for an organic light-emitting diode. The pixel arrangement structure includes a plurality of red subpixel groups, a plurality of green subpixel groups, and a plurality of blue subpixel groups, wherein each of the plurality of red subpixel groups is comprised of a plurality of red subpixels, each of the plurality of green subpixel groups is comprised of a plurality of green subpixels, and each of the plurality of blue subpixel groups is comprised of a plurality of blue subpixels.

The plurality of red subpixel groups, the plurality of green subpixel groups, and the plurality of blue subpixel groups are spaced from each other. One of the plurality of red subpixels of the plurality of red subpixel groups, one of the plurality of green subpixels of the plurality of green subpixel groups, and one of the plurality of blue subpixels of the plurality of blue subpixel groups, which are adjacent to each other, together form a pixel.

In the pixel arrangement structure for an OLED according to the present invention, the subpixels of the same color are arranged and connected to form a subpixel group, and subpixel groups are arranged to be spaced from each other such that each three adjacent subpixels comprised of a red subpixel, a green subpixel, and a blue subpixel together form a pixel. In comparison with conventional techniques using a single subpixel, given the same resolution (ppi) of the OLED display screen, gathering a plurality of subpixels into a subpixel group can increase the aperture ratio of metal masks (fine metal masks), solving the difficulties in the process using metal masks. Alternatively, given the same aperture ratio of the masks, each subpixel in a subpixel group can be made smaller to increase the resolution of the OLED display screen.

Each of the plurality of red subpixel groups can include two red subpixels. Each of the plurality of green subpixel groups can include two green subpixels. Each of the plurality of blue subpixel groups can include two blue subpixels.

The pixel arrangement structure can further include a plurality of first subpixel rows and a plurality of second subpixel rows. Each of the plurality of first subpixel rows includes first red subpixel groups, first green subpixel groups, and first blue subpixel groups arranged in sequence in a first direction. Each of the plurality of second subpixel rows includes second red subpixel groups, second green subpixel groups, and second blue subpixel groups arranged in sequence in the first direction.

The plurality of first subpixel rows and the plurality of second subpixel rows are spaced from each other. The first red subpixel groups, the first green subpixel groups, and the first blue subpixel groups in each of the plurality of first subpixel rows are misaligned with the second red subpixel groups, the second green subpixel groups, and the second blue subpixel groups of the plurality of second subpixel rows in the first direction, such that each three adjacent subpixels comprised of a red subpixel, a green subpixel, and a blue subpixel together form a pixel, wherein each three adjacent subpixels are respectively of the plurality of first subpixel rows and the plurality of second subpixel rows. Two subpixels respectively of any one of the plurality of red subpixel groups, the plurality of green subpixel groups, and the plurality of blue subpixel groups are arranged in a second direction perpendicular to the first direction.

In an example, each three adjacent subpixels comprised of a red subpixel, a green subpixel, and a blue subpixel and forming a pixel includes two subpixels of two adjacent subpixel groups of the plurality of first subpixel rows and one subpixel of one subpixel group of the plurality of second subpixel rows. Two pixels adjacent to each other in the first direction include:

a red subpixel, two green subpixels, and two blue subpixels; or a green subpixel, two blue subpixels, and two red subpixels; or a blue subpixel, two red subpixels, and two green subpixels.

In another example, each three adjacent subpixels comprised of a red subpixel, a green subpixel, and a blue subpixel and forming a pixel includes a subpixel of one subpixel group of the plurality of first subpixel rows and two subpixels of two adjacent subpixel groups of the plurality of second subpixel rows. Two pixels adjacent to each other in the first direction include:

a red subpixel, two green subpixels, and two blue subpixels; or a green subpixel, two blue subpixels, and two red subpixels; or a blue subpixel, two red subpixels, and two green subpixels.

The first direction can be the column direction, and the second direction can be the row direction.

Alternatively, the first direction can be the row direction, and the second direction can be the column direction.

In the pixel arrangement structure for an OLED according to the present invention, since two adjacent pixels share a subpixel, the number of subpixels can be reduced, simplifying the procedures and saving the production costs.

In another embodiment, a pixel arrangement structure for an OLED includes a first pixel group and a second pixel group. Each of the first pixel group and the second pixel group includes first, second, and third subpixels arranged triangularly. The second subpixel of the first pixel group is connected to the second subpixel of the second pixel group. The third subpixel of the first pixel group is connected to the third subpixel of the second pixel group. The first, second, and third subpixels have different colors.

The first pixel group and the second pixel group can be arranged in a first direction. The second subpixel and the third subpixel of the first pixel group are arranged in a second direction perpendicular to the first direction. The second subpixel and the third subpixel of the second pixel group are arranged in the second direction.

The pixel arrangement structure for an OLED of this embodiment can further include a third pixel group. The third pixel group includes first, second, and third subpixels arranged triangularly. The first subpixel of the third pixel group is connected to the first subpixel of the first pixel group or the first subpixel of the second pixel group in the first direction.

The subpixels having the same color and respectively of two pixel groups are connected to each other. In comparison with conventional techniques using a single subpixel, given the same resolution (ppi) of the OLED display screen, the aperture ratio of metal masks (fine metal masks) can be increased to solve the difficulties in the process using metal masks. Alternatively, given the same aperture ratio of the masks, each subpixel in a subpixel group can be made smaller to increase the resolution of the OLED display screen.

The present invention will become clearer in light of the following detailed description of illustrative embodiments of this invention described in connection with the drawings.

DETAILED DESCRIPTION OF THE INVENTION

Figure 1:
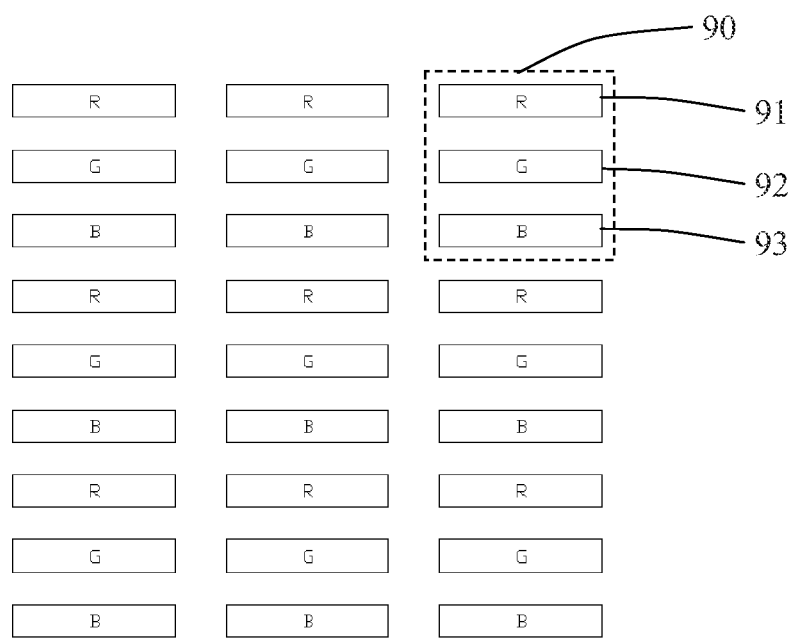
FIG. 1 is a diagrammatic view of a conventional pixel arrangement structure for an organic light-emitting diode.
Figure 2:
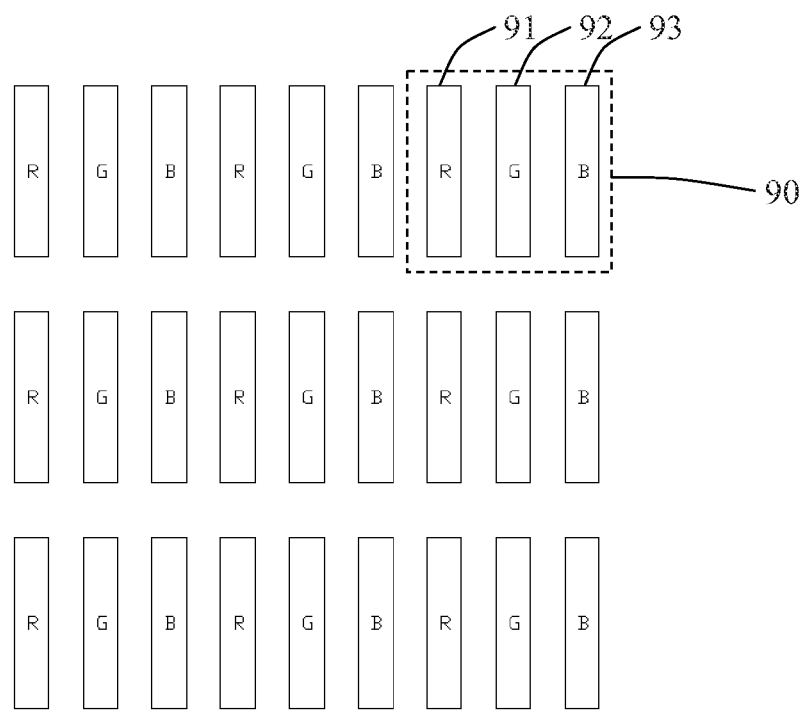
FIG. 2 is a diagrammatic view of another conventional pixel arrangement structure for an organic light-emitting diode.
Figure 3:
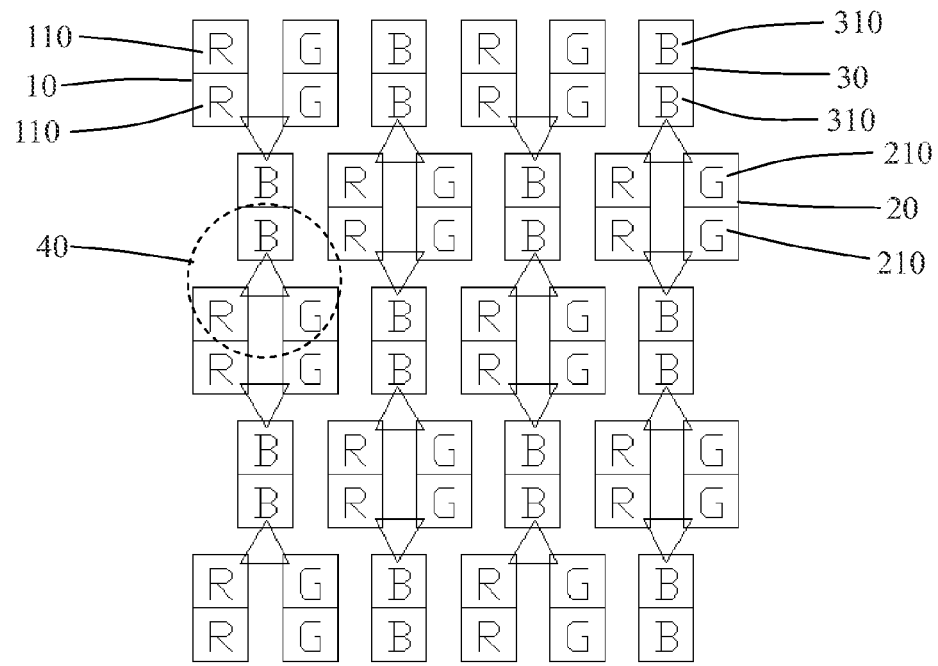
FIG. 3 is a diagrammatic view of a pixel arrangement structure for an organic light-emitting diode according to the present invention.

FIG. 3 is a diagrammatic view of a pixel arrangement structure for an organic light-emitting diode (OLED) according to the present invention. The pixel arrangement structure includes a plurality of red subpixel groups 10, a plurality of green subpixel groups 20, and a plurality of blue subpixel groups 30. Each red subpixel group 10 is comprised of a plurality of red subpixels 110. Each green subpixel group 20 is comprised of a plurality of green subpixels 210. Each blue subpixel group 30 is comprised of a plurality of blue subpixels 310.

The red subpixel groups 10, the green subpixel groups 20, and the blue subpixel groups 30 are spaced from each other. One of the red subpixels 110 of the red subpixel groups 10, one of the green subpixels 210 of the green subpixel groups 20, and one of the blue subpixels 310 of the blue subpixel groups 30, which are adjacent to each other, together form a pixel 40.

Specifically, the pixel arrangement structure for an OLED according to the present invention includes:

a plurality of first subpixel rows, with each first subpixel row including first red subpixel groups, first green subpixel groups, and first blue subpixel groups arranged in sequence in a first direction; and a plurality of second subpixel rows, with each second subpixel row including second red subpixel groups, second green subpixel groups, and second blue subpixel groups arranged in sequence in the first direction.

The first subpixel rows and the second subpixel rows are spaced from each other. The first red subpixel groups, the first green subpixel groups, and the first blue subpixel groups in each first subpixel row are misaligned with the second red subpixel groups, the second green subpixel groups, and the second blue subpixel groups of the second subpixel rows in the first direction, such that each three adjacent subpixels comprised of a red subpixel, a green subpixel, and a blue subpixel together form a pixel, wherein each three adjacent subpixels are respectively of the first subpixel rows and the second subpixel rows. Two subpixels respectively of any one of the red subpixel groups 10, the green subpixel groups 20, and the blue subpixel groups 30 are arranged in a second direction perpendicular to the first direction.

There are two ways to define the pixel:

(1) Each three adjacent subpixels comprised of a red subpixel, a green subpixel, and a blue subpixel and forming a pixel includes two subpixels of two adjacent subpixel groups of the first subpixel rows and one subpixel of one subpixel group of the second subpixel rows. Two pixels adjacent to each other in the first direction include:

a red subpixel, two green subpixels, and two blue subpixels; or a green subpixel, two blue subpixels, and two red subpixels; or a blue subpixel, two red subpixels, and two green subpixels.

(2) Each three adjacent subpixels comprised of a red subpixel, a green subpixel, and a blue subpixel and forming a pixel includes one subpixel of one subpixel group of the first subpixel rows and two subpixels of two adjacent subpixel groups of the second subpixel rows. Two pixels adjacent to each other in the first direction include:
- a red subpixel, two green subpixels, and two blue subpixels; or
- a green subpixel, two blue subpixels, and two red subpixels; or
- a blue subpixel, two red subpixels, and two green subpixels.

The first direction can be the column direction, and the second direction can be the row direction.

Alternatively, the first direction can be the row direction, and the second direction can be the column direction.

Since two adjacent pixels share a subpixel, the number of subpixels in the pixel arrangement structure for an OLED according to the present invention can be reduced, simplifying the procedures and saving the production costs.

Two embodiments of the pixel arrangement structure for an OLED according to the present invention will now be set forth.

First Embodiment

Figure 4:
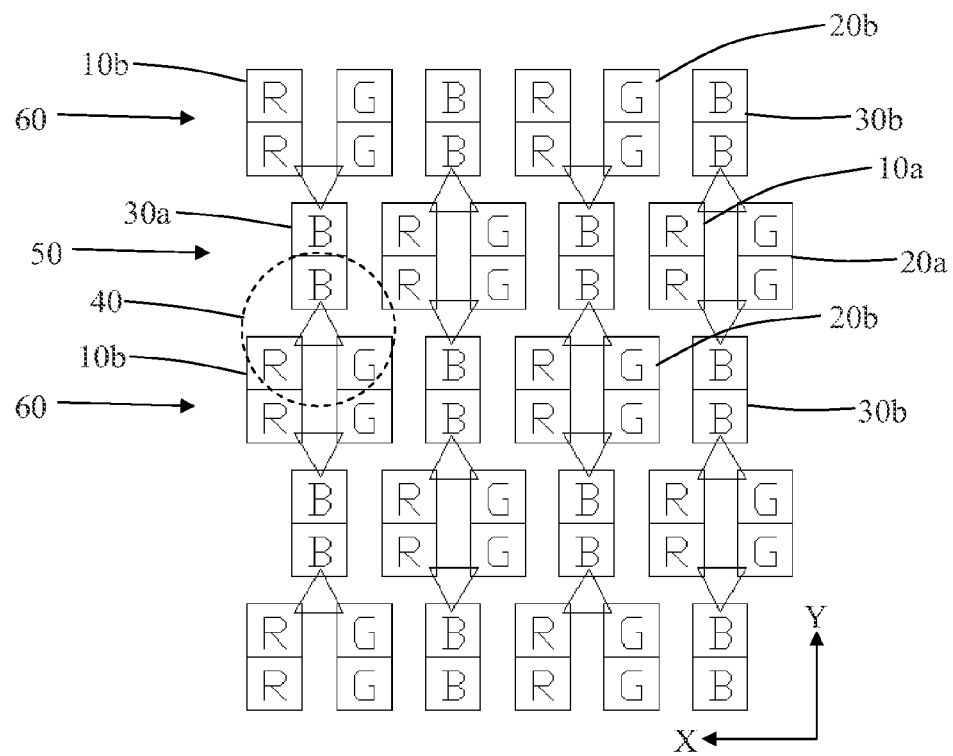
FIG. 4 is a diagrammatic view of a pixel arrangement structure for an organic light-emitting diode of a first embodiment according to the present invention.

FIG. 4 is a diagrammatic view of a pixel arrangement structure for an OLED of the first embodiment according to the present invention. In the first embodiment, the first direction is the column direction (X direction), and the second direction is the row direction (Y direction). In this embodiment, the pixel arrangement structure for an OLED includes:
- a plurality of first subpixel rows 50, with each first subpixel row 50 including first red subpixel groups 10a, first green subpixel groups 20a, and first blue subpixel groups 30a arranged in sequence in the column direction; and
- a plurality of second subpixel rows 60, with each second subpixel row 60 including second red subpixel groups 10b, second green subpixel groups 20b, and second blue subpixel groups 30b arranged in sequence in the column direction.

The first subpixel rows 50 and the second subpixel rows 60 are spaced from each other. The first red subpixel groups 10a, the first green subpixel groups 20a, and the first blue subpixel groups 30a in each first subpixel row 50 are misaligned with the second red subpixel groups 10b, the second green subpixel groups 20b, and the second blue subpixel groups 30b of the second subpixel rows 60 in the column direction, such that each three adjacent subpixels comprised of a red subpixel, a green subpixel, and a blue subpixel together form a pixel 40, wherein each three adjacent subpixels are respectively of the first subpixel rows 50 and the second subpixel rows 60. Two subpixels respectively of any one of the red subpixel groups 10a, the green subpixel groups 20a, and the blue subpixel groups 30a are arranged in the row direction.

Figure 5:
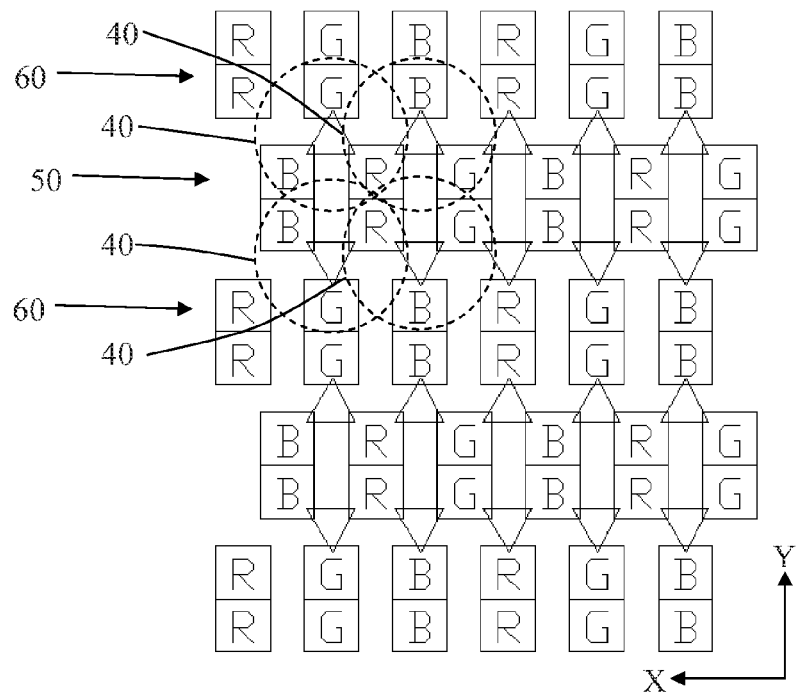
FIG. 5 is a diagrammatic view illustrating a first example of defining a pixel of the pixel arrangement structure of FIG. 4.

FIG. 5 is a diagrammatic view illustrating a first example of defining a pixel of the pixel arrangement structure of the first embodiment shown in FIG. 4. The defining direction of each pixel is indicated by A (delta) shown in FIG. 5. Each three adjacent subpixels comprised of a red subpixel, a green subpixel, and a blue subpixel and forming a pixel 40 includes two subpixels of two adjacent subpixel groups of the first subpixel rows 50 and one subpixel of one subpixel group of the second subpixel rows 60. Two pixels 40 adjacent to each other in the column direction include:
- a red subpixel 110, two green subpixels 210, and two blue subpixels 310; or
- a green subpixel 210, two blue subpixels 310, and two red subpixels 110; or
- a blue subpixel 310, two red subpixels 110, and two green subpixels 210.

Figure 6:
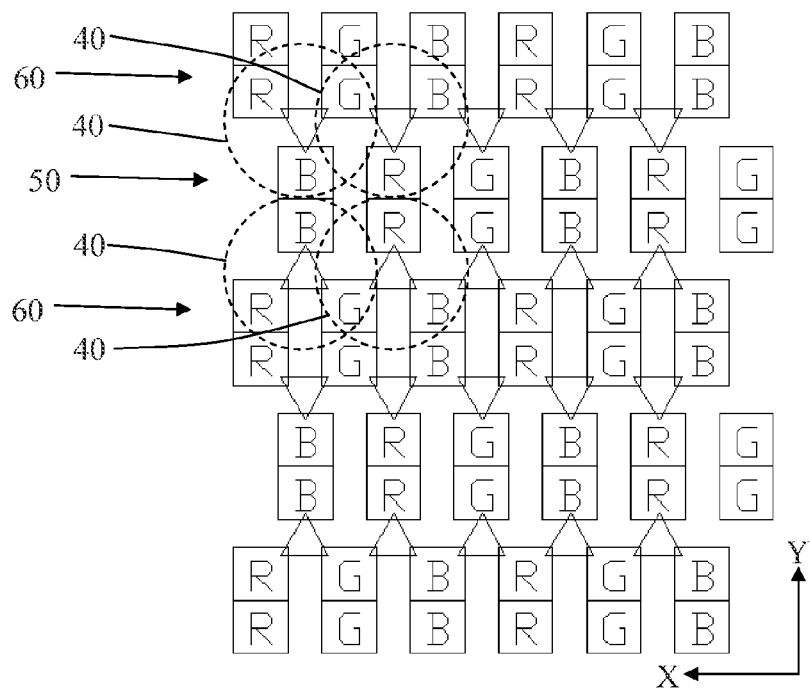
FIG. 6 is a diagrammatic view illustrating a second example of defining a pixel of the pixel arrangement structure of FIG. 4.

FIG. 6 is a diagrammatic view illustrating a second example of defining a pixel of the pixel arrangement structure of the first embodiment shown in FIG. 4. The defining direction of each pixel is indicated by A (delta) shown in FIG. 6. Each three adjacent subpixels comprised of a red subpixel, a green subpixel, and a blue subpixel and forming a pixel 40 includes one subpixel of one subpixel group of the first subpixel rows 50 and two subpixels of two adjacent subpixel groups of the second subpixel rows 60. Two pixels 40 adjacent to each other in the column direction include:
- a red subpixel 110, two green subpixels 210, and two blue subpixels 310; or
- a green subpixel 210, two blue subpixels 310, and two red subpixels 110; or
- a blue subpixel 310, two red subpixels 110, and two green subpixels 210.

Second Embodiment

Figure 7:
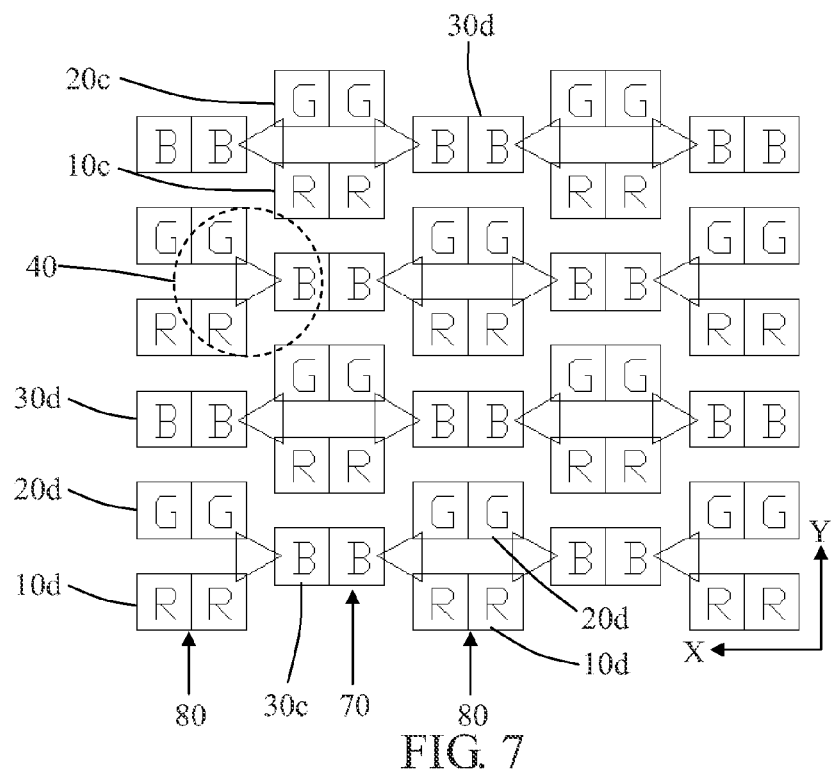
FIG. 7 is a diagrammatic view of a pixel arrangement structure for an organic light-emitting diode of a second embodiment according to the present invention.

FIG. 7 is a diagrammatic view of a pixel arrangement structure for an organic light-emitting diode of a second embodiment according to the present invention. In the second embodiment, the first direction is the row direction (Y direction), and the second direction is the column direction (X direction). In this embodiment, the pixel arrangement structure for an OLED includes:
- a plurality of first subpixel rows 70, with each first subpixel row 70 including first red subpixel groups 10c, first green subpixel groups 20c, and first blue subpixel groups 30c arranged in sequence in the column direction; and
- a plurality of second subpixel rows 80, with each second subpixel row 80 including second red subpixel groups 10d, second green subpixel groups 20d, and second blue subpixel groups 30d arranged in sequence in the column direction.

The first subpixel rows 70 and the second subpixel rows 80 are spaced from each other. The first red subpixel groups 10c, the first green subpixel groups 20c, and the first blue subpixel groups 30c in each first subpixel row 70 are misaligned with the second red subpixel groups 10d, the second green subpixel groups 20d, and the second blue subpixel groups 30d of the second subpixel rows 80 in the row direction, such that each three adjacent subpixels comprised of a red subpixel, a green subpixel, and a blue subpixel together form a pixel 40, wherein each three adjacent subpixels are respectively of the first subpixel rows 70 and the second subpixel rows 80. Two subpixels respectively of any one of the red subpixel groups 10c, the green subpixel groups 20c, and the blue subpixel groups 30c are arranged in the column direction.

Figure 8:
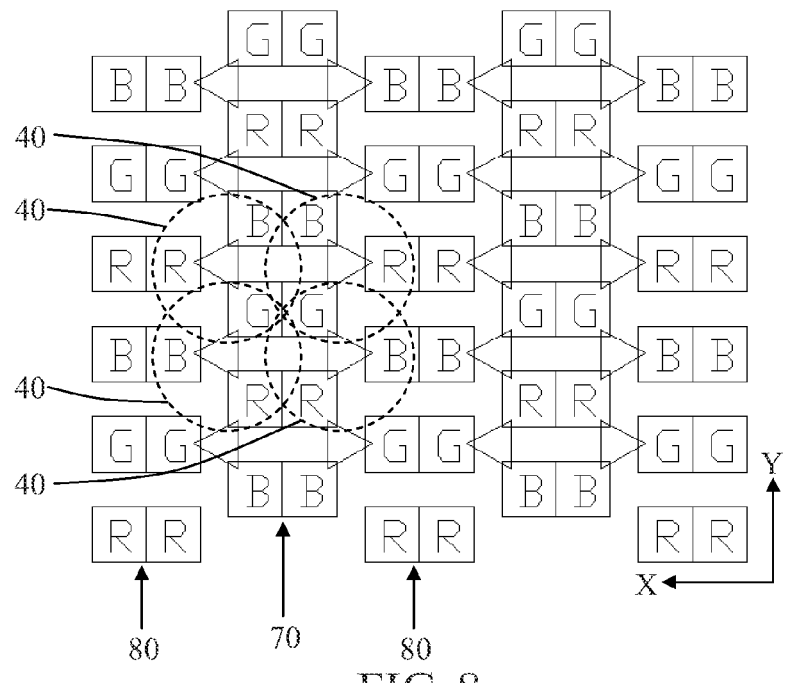
FIG. 8 is a diagrammatic view illustrating a first example of defining a pixel of the pixel arrangement structure of FIG. 7.

FIG. 8 is a diagrammatic view illustrating a first example of defining a pixel of the pixel arrangement structure of the second embodiment shown in FIG. 7. The defining direction of each pixel is indicated by A (delta) shown in FIG. 8. Each three adjacent subpixels comprised of a red subpixel, a green subpixel, and a blue subpixel and forming a pixel 40 includes two subpixels of two adjacent subpixel groups of the first subpixel rows 70 and one subpixel of one subpixel group of the second subpixel rows 80. Two pixels 40 adjacent to each other in the row direction include:
- a red subpixel 110, two green subpixels 210, and two blue subpixels 310; or
- a green subpixel 210, two blue subpixels 310, and two red subpixels 110; or
- a blue subpixel 310, two red subpixels 110, and two green subpixels 210.

Figure 9:
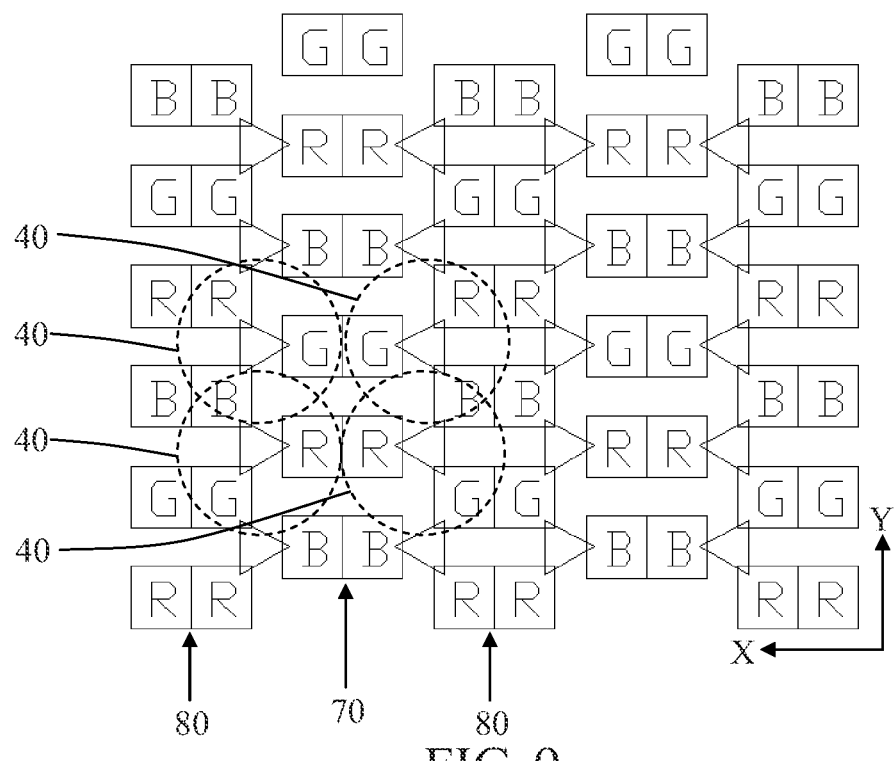
FIG. 9 is a diagrammatic view illustrating a second example of defining a pixel of the pixel arrangement structure of FIG. 7.

FIG. 9 is a diagrammatic view illustrating a second example of defining a pixel of the pixel arrangement structure of the second embodiment shown in FIG. 7. The defining direction of each pixel is indicated by Δ (delta) shown in FIG. 9. Each three adjacent subpixels comprised of a red subpixel, a green subpixel, and a blue subpixel and forming a pixel 40 includes a subpixel of one subpixel group of the first subpixel rows 70 and two subpixels of two adjacent subpixel groups of the second subpixel rows 80. Two pixels 40 adjacent to each other in the row direction include:
- a red subpixel 110, two green subpixels 210, and two blue subpixels 310; or
- a green subpixel 210, two blue subpixels 310, and two red subpixels 110; or
- a blue subpixel 310, two red subpixels 110, and two green subpixels 210.

In the pixel arrangement structure for an OLED according to the present invention, the subpixels of the same color are arranged and connected to form a subpixel group, and subpixel groups are arranged to be spaced from each other such that each three adjacent subpixels comprised of a red subpixel, a green subpixel, and a blue subpixel together form a pixel. In comparison with conventional techniques using a single subpixel, given the same resolution (ppi) of the OLED display screen, gathering a plurality of subpixels into a subpixel group can increase the aperture ratio of metal masks (fine metal masks), solving the difficulties in the process using metal masks. Alternatively, given the same aperture ratio of the masks, each subpixel in a subpixel group can be made smaller to increase the resolution of the OLED display screen. Furthermore, since two adjacent pixels share a subpixel, the number of subpixels can be reduced, simplifying the procedures and saving the production costs.

Figure 10:
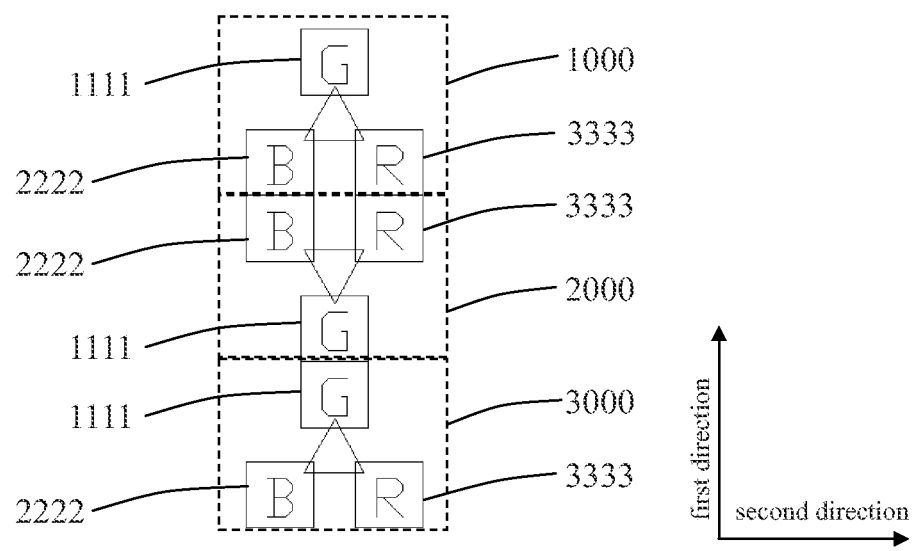
FIG. 10 is a diagrammatic view of a pixel arrangement structure for an organic light-emitting diode of a third embodiment according to the present invention.

FIG. 10 is a diagrammatic view of a pixel arrangement structure for an OLED of a third embodiment according to the present invention. In this embodiment, the pixel arrangement structure for an OLED includes a first pixel group 1000 and a second pixel group 2000. Each of the first pixel group 1000 and the second pixel group 2000 includes first, second, and third subpixels 1111, 2222, and 3333 arranged triangularly. The second subpixel 2222 of the first pixel group 1000 connected to the second subpixel 2222 of the second pixel group 2000. The third subpixel 3333 of the first pixel group 1000 connected to the third subpixel 3333 of the second pixel group 1000. The first, second, and third subpixels 1111, 2222, and 3333 have different colors. The first pixel group 1000 and the second pixel group 2000 are arranged in a first direction. The second subpixel 2222 and the third subpixel 3333 of the first pixel group 1000 are arranged in a second direction perpendicular to the first direction. The second subpixel 2222 and the third subpixel 3333 of the second pixel group 2000 are arranged in the second direction. Preferably, the first subpixel 1111 is a green subpixel, the second subpixel 2222 is a blue subpixel, and the third subpixel 3333 is a red subpixel.

In this embodiment, the pixel arrangement structure for an OLED further includes a third pixel group 3000. The third pixel group 300 also includes first, second, and third subpixels 1111, 2222, and 3333 arranged triangularly. The first subpixel 1111 of the third pixel group 3000 is connected to the first subpixel 1111 of the first pixel group 1000 or the first subpixel 1111 of the second pixel group 2000 in the first direction.

In this embodiment, the subpixels having the same color and respectively of two pixel groups are connected to each other. In comparison with conventional techniques using a single subpixel, given the same resolution (ppi) of the OLED display screen, the aperture ratio of metal masks (fine metal masks) can be increased to solve the difficulties in the process using metal masks. Alternatively, given the same aperture ratio of the masks, each subpixel in a subpixel group can be made smaller to increase the resolution of the OLED display screen. Furthermore, since two adjacent pixels share a subpixel, the number of subpixels can be reduced, simplifying the procedures and saving the production costs.

Thus since the illustrative embodiments disclosed herein may be embodied in other specific forms without departing from the spirit or general characteristics thereof, some of which forms have been indicated, the embodiments described herein are to be considered in all respects illustrative and not restrictive. The scope is to be indicated by the appended claims, rather than by the foregoing description, and all changes which come within the meaning and range of equivalency of the claims are intended to be embraced therein.

The invention claimed is:

1. A pixel arrangement structure for an organic light-emitting diode, comprising:
   a plurality of red subpixel groups, each of the plurality of red subpixel groups comprising two red subpixels placed adjacent to each other and aligned in a first direction;
   a plurality of green subpixel groups, each of the plurality of green subpixel groups comprising two green subpixels placed adjacent to each other and aligned in the first direction; and
   a plurality of blue subpixel groups, each of the plurality of blue subpixel groups comprising two blue subpixels placed adjacent to each other and aligned in the first direction,
   wherein
   the plurality of red subpixel groups, the plurality of green subpixel groups, and the plurality of blue subpixel groups are spaced from each other,
   a repeated sequence of a red subpixel group, a green subpixel group, and a blud subpixel group forms a linear array in a second direction transversal to the first direction,
   the linear array is repeated a plurality of times in the first direction and forms the pixel arrangement structure, each linear array is shifted in the second direction relative to an adjacent linear array,
   and
   one of the plurality of red subpixels of the plurality of red subpixel groups and one of the plurality of green subpixels of the plurality of green subpixel groups of a linear array, and one of the plurality of blue subpixels of the plurality of blue subpixel groups of an adjacent linear array form a pixel.

2. The pixel arrangement structure for an organic light-emitting diode according to claim 1, wherein the first direction is a column direction, and the second direction is a row direction.

3. The pixel arrangement structure for an organic light-emitting diode according to claim 1, wherein the first direction is a row direction, and the second direction is a column direction.

4. The pixel arrangement structure for an organic light-emitting diode according to claim 1, wherein the first direction is a row direction, and the second direction is a column direction.

5. The pixel arrangement structure for an organic light-emitting diode according to claim 1, wherein the first direction is a row direction, and the second direction is a column direction.

6. The pixel arrangement structure for an organic light-emitting diode of claim 1, wherein the pixel can also be formed by one of the plurality of red subpixels of the plurality of red subpixel groups of a linear array and one of the plurality of green subpixels of the plurality of green subpixel groups and one of the plurality of blue subpixels of the plurality of blue subpixel groups of an adjacent linear array.

7. The pixel arrangement structure for an organic light-emitting diode of claim 1, wherein one subpixel from one of the plurality of subpixels of green, red, or blue subpixel group can be part of two adjacent pixels.

8. A pixel arrangement structure for an organic light-emitting diode, comprising:
a first pixel group, a second pixel group, and a third pixel group, each pixel group comprising first, second, and third subpixels arranged triangularly, wherein the second subpixel of the first pixel group and the second subpixel of the second pixel group having a first color and forming a first subgroup, the third subpixel of the first pixel group and the third subpixel of the second pixel group having a second color and forming a second subgroup, and the first subpixel of the second group and the first subpixel of the third group having a third color and forming a third subgroup, wherein the first, second, and third colors are different from each other.

9. The pixel arrangement structure for an organic light-emitting diode according to claim 8, wherein the first pixel group and the second pixel group are arranged in a first direction, the second subpixel and the third subpixel of the first pixel group are arranged in a second direction perpendicular to the first direction, and the second subpixel and the third subpixel of the second pixel group are arranged in the second direction.

10. The pixel arrangement structure for an organic light-emitting diode according to claim 9, wherein the first pixel group, the second pixel group, and the third pixel group are adjacent to each other and disposed linearly in a first direction.

* * * * *